United States Patent
Thompson et al.

(10) Patent No.: US 8,214,086 B2
(45) Date of Patent: Jul. 3, 2012

(54) SYSTEMS AND METHODS FOR RETRACTABLE FAN COOLING OF ELECTRONIC ENCLOSURES

(75) Inventors: Kevin Thompson, Chaska, MN (US); Michael J. Nelson, Prior Lake, MN (US); Paul Schatz, Burnsville, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 267 days.

(21) Appl. No.: 12/752,465

(22) Filed: Apr. 1, 2010

(65) Prior Publication Data

US 2011/0245976 A1    Oct. 6, 2011

(51) Int. Cl.
*G06F 19/00*    (2011.01)
(52) U.S. Cl. .................... 700/300; 700/275
(58) Field of Classification Search ........... 700/275, 700/300; 361/695, 687, 704
See application file for complete search history.

(56) References Cited

U.S. PATENT DOCUMENTS

| | | | |
|---|---|---|---|
| 3,748,108 A * | 7/1973 | Rothwarf et al. ............. 428/656 |
| 4,742,864 A | 5/1988 | Duell et al. | |
| 5,894,407 A | 4/1999 | Aakalu et al. | |
| 5,946,193 A | 8/1999 | Hendrix et al. | |
| 6,065,612 A | 5/2000 | Rinderer | |
| 6,082,441 A | 7/2000 | Boehmer et al. | |
| 6,129,181 A * | 10/2000 | Weems ............................ 185/37 |
| 6,142,595 A | 11/2000 | Dellapi et al. | |
| 6,238,027 B1 | 5/2001 | Kohler et al. | |
| 6,253,834 B1 | 7/2001 | Sterner | |
| 6,310,772 B1 | 10/2001 | Hutchison et al. | |
| 6,474,410 B1 * | 11/2002 | Minich et al. ............. 165/104.33 |
| 6,788,535 B2 | 9/2004 | Dodgen et al. | |
| 6,827,130 B2 * | 12/2004 | Larson ........................ 165/80.3 |
| 6,968,647 B2 | 11/2005 | Levesque et al. | |
| 6,995,978 B2 | 2/2006 | Strauss | |
| 7,027,300 B2 | 4/2006 | Lord | |
| 7,080,989 B2 * | 7/2006 | Gates .............................. 439/73 |
| 7,225,586 B2 | 6/2007 | Levesque et al. | |
| 7,245,485 B1 | 7/2007 | Morrell | |
| 7,316,606 B2 * | 1/2008 | Shipley et al. ................ 454/184 |
| 7,355,848 B1 | 4/2008 | Hodge et al. | |
| 7,450,382 B1 | 11/2008 | Fischer et al. | |
| 7,580,259 B2 * | 8/2009 | Hsiao ........................... 361/695 |
| 7,852,190 B1 * | 12/2010 | Woychik et al. .............. 337/382 |
| 2006/0279927 A1 | 12/2006 | Strohm | |
| 2006/0291170 A1 * | 12/2006 | Hsiao ........................... 361/704 |
| 2007/0041157 A1 * | 2/2007 | Wang ........................... 361/687 |
| 2007/0247809 A1 | 10/2007 | McClure | |
| 2008/0238270 A1 | 10/2008 | Wayman et al. | |
| 2008/0239632 A1 | 10/2008 | Wayman | |
| 2008/0278912 A1 | 11/2008 | Zavadsky et al. | |

* cited by examiner

*Primary Examiner* — Michael D Masinick
(74) *Attorney, Agent, or Firm* — Fogg & Powers LLC

(57) ABSTRACT

Systems and methods for a retractable fan cooling system for an electronics enclosure are provided. In one embodiment, a system comprises at least one cooling fan coupled to an electronics enclosure having a heat sink; and a fan positioning mechanism coupled to the at least one cooling fan. When a temperature inside the electronics enclosure is less than a first temperature, the positioning mechanism places the at least one cooling fan into a retracted position that does not inhibit a natural convective air flow across the heat sink. When the temperature inside the enclosure is greater than a second temperature, the positioning mechanism places the at least one cooling fan into an engaged position that produces a forced air flow across the heat sink.

16 Claims, 9 Drawing Sheets

SYSTEMS AND METHODS FOR RETRACTABLE FAN COOLING OF ELECTRONIC ENCLOSURES

BACKGROUND

In the field of telecommunications, there is a trend to reduce both the size and the expenses associated with infrastructure equipment. The result is a demand on telecommunications infrastructure equipment providers to manufacture smaller equipment that can be operated and maintained in a more cost effective manner, while retaining all the functionality of legacy equipment. The modularity of designs proposed for such equipment, along with the smaller sizes desired by system operators, has introduced new thermal management challenges for dissipating heat generated by telecommunications infrastructure equipment.

Cooling fans used in conjunction with heat sinks are one means used for removing heat from equipment cabinets into the surrounding environment. The thermal energy generated from electronics equipment is directed to a heat sink that is either mounted to or an integral part of the equipment cabinet. The heat sink will typically have a plurality of fins exposed to the ambient atmosphere. The fins establish a large surface area that is in contact with the external ambient atmosphere, promoting thermal heat transfer from the heat sink to the atmosphere. The cooling fans establish a continuous stream of forced air through the heat sink fins, which removes the heated air from the proximity of the heat sink and replaces the heated air with relatively cooler air having a greater capacity for absorbing heat. One problem with this approach is that the fans must be continuously running in order to create the forced air circulation over the fins. In some areas, civic officials object to the noise created by such fan operation as a public nuisance. Further, reliability of the enclosed system becomes dependent on keeping the fans running so that electronic equipment does not overheat and fail. Thus the reliability of the system is essentially limited to the mean-time-between-failure (MTBF) ratings of the fans.

For the reasons stated above and for other reasons stated below which will become apparent to those skilled in the art upon reading and understanding the specification, there is a need in the art for improved systems and methods for equipment cooling.

SUMMARY

The Embodiments of the present invention provide methods and systems for cooling electronics equipment enclosures, and will be understood by reading and studying the following specification.

In one embodiment, a system comprises at least one cooling fan coupled to an electronics enclosure having a heat sink; and a fan positioning mechanism coupled to the at least one cooling fan. When a temperature inside the electronics enclosure is less than a first temperature, the positioning mechanism places the at least one cooling fan into a retracted position that does not inhibit a natural convective air flow across the heat sink. When the temperature inside the enclosure is greater than a second temperature, the positioning mechanism places the at least one cooling fan into an engaged position that produces a forced air flow across the heat sink.

BRIEF DESCRIPTION OF THE DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

This disclosure describes systems and methods for utilizing retractable fans for the cooling of electrical equipment, such as but not limited to telecommunications equipment, housed inside an enclosure.

Embodiments of the present invention provide system and methods that move cooling fans out of the way of a heat sink's natural convection path at under conditions where forced air circulation is not necessary to keep electronic devices within their rated operating temperature range. One of ordinary skill in the art after reading this specification would recognize several benefits provided by embodiments of the present invention. First, by not entirely relying on continuous force air circulation to move heated air away from a heat sink, the cooling fans will have a relatively longer effective life since the fans are turned off when not needed. Second, by moving the fans out of the heat sink's natural convection path when not in use, the fan components are not continuously exposed to the heated air, thus reducing degradation of fan components due to thermal aging. Finally, when de-energized cooling fans are moved out of the way of the heat sink's natural convection path, there is no obstruction blocking the natural convective flow through the heatsink allowing for greater velocities which in turn increases the heatsink's effectiveness. The ambient temperature within the cabinet can therefore be allowed to rise to a higher temperature setpoint before the need to turn on forced air circulation arises. When the ambient temperature within the cabinet reaches certain predetermined setpoints (or alternatively, a component temperature of one or more specific devices within the cabinet), the fans move from their retracted position into one of a potential plurality of operating positions to supply forced air circulation, or a combination of forced air and natural convections.

Figure 1:
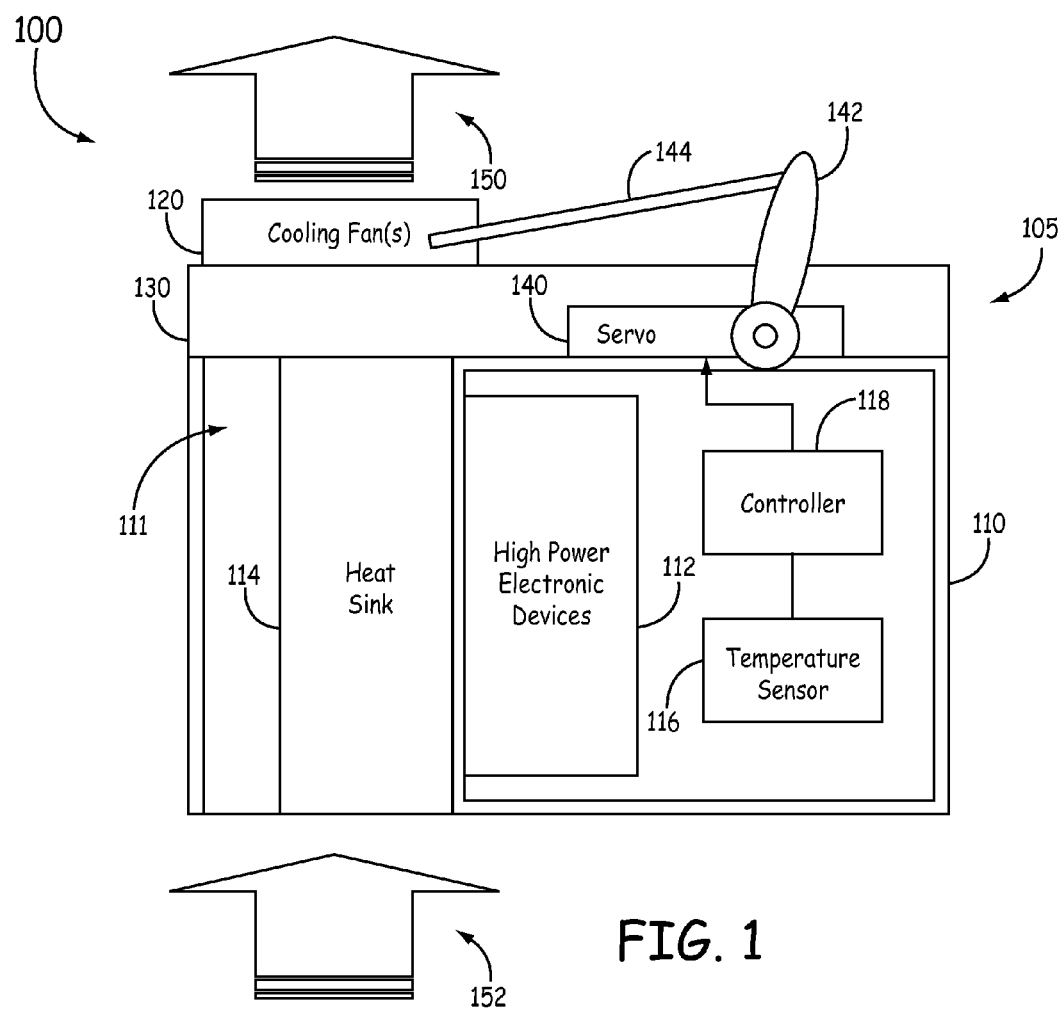
FIG. 1 is a block diagram illustrating a retractable fan cooling system for an electronics enclosure of one embodiment of the present invention.

FIG. 1 is a block diagram illustrating generally at 100 one embodiment of the present invention for a retractable fan cooling system 105 for an electronics enclosure 110. Electronics enclosure 110 houses one or more high power electronic devices 112, such as radio frequency amplifiers, that produce significant quantities of heat when in operation. The high power electronic devices 112 are thermally coupled to a heat sink 114 that absorbs the heat generated by the high power electronic devices 112 and transfers the heat to the environment surrounding enclosure 110. In one embodiment, heat sink 114 is a separate component mounted externally to enclosure 110 in the proximity of high power electronic devices 112. In other embodiments, heat sink 114 is an integral to enclosure 110. In one embodiment, enclosure 110 includes a chamber 111 for directing the external air across the heat sink 114 to facilitate efficient heat transfer.

The retractable fan cooling system 105 includes at least, but not limited to, one cooling fan 120 placed within a track 130 along the upper surface of cabinet 110. In one embodiment, two fans are used for redundancy and increased cooling at peak operating conditions. In one embodiment, track 130 comprises a set of linear bearings. In the particular embodiments illustrated by FIGS. 1, 2A and 2B, cooling fan 120's position on track 130 is controlled via an electrical servo 140 mechanically coupled to cooling fan 120 via linkage members 142 and 144. Servo 140 applies a rotational force to linkage members 142 and 144 that causes cooling fan 120 to slide across track 130. Cooling system 105 further includes a temperature sensor 116 and a temperature controller 118 which activates servo 140 based on temperature measurements from within enclosure 110.

In operation, when temperatures measured by temperature sensor 116 are relatively low, and below a threshold setpoint, controller 118 operates servo 140 to maintain cooling fan 120 in a retracted position (such as shown generally at 210 in FIG. 2A) so that cooling fan 120 does not block the naturally convective air flow across heat sink 114 and through chamber 111. Under natural convection heat is transferred from the fins 113 of heat sink 114 into the air in chamber 111. The warmed air rises as it is heated, exiting the top of chamber 111 (shown generally at 150) and pulling unheated air into chamber 111 (shown generally at 150).

When temperatures measured by temperature sensor 116 increases, the heat removal provided by natural convection through heat sink 114 may no longer be sufficient to maintain temperatures in enclosure 110 below the designed operating limits of the high power electronic devices 112. Therefore, when the temperature measured by temperature sensor 116 increases above another threshold setpoint, controller 118 operates servo 140 to position cooling fan 120 over heat sink 114 and chamber 111 to create a forced air flow circulation through the fins 113 of heat sink 114. Operating the cooling fan 120 over the heat sink 114 and chamber 111 pulls a larger volume of air per unit time through the fins 113 than is achieved through natural convection. This results in an increased ability to remove the heat from within enclosure 110. As mentioned above, in alternate embodiments, the temperature measured by temperature sensor 116 can be either a measurement of ambient temperature within enclosure 110, or a measurement of a component temperature of a specific device or surface within enclosure 110. In one embodiment, using measurements of both ambient and component temperatures is contemplated.

Figure 2A:
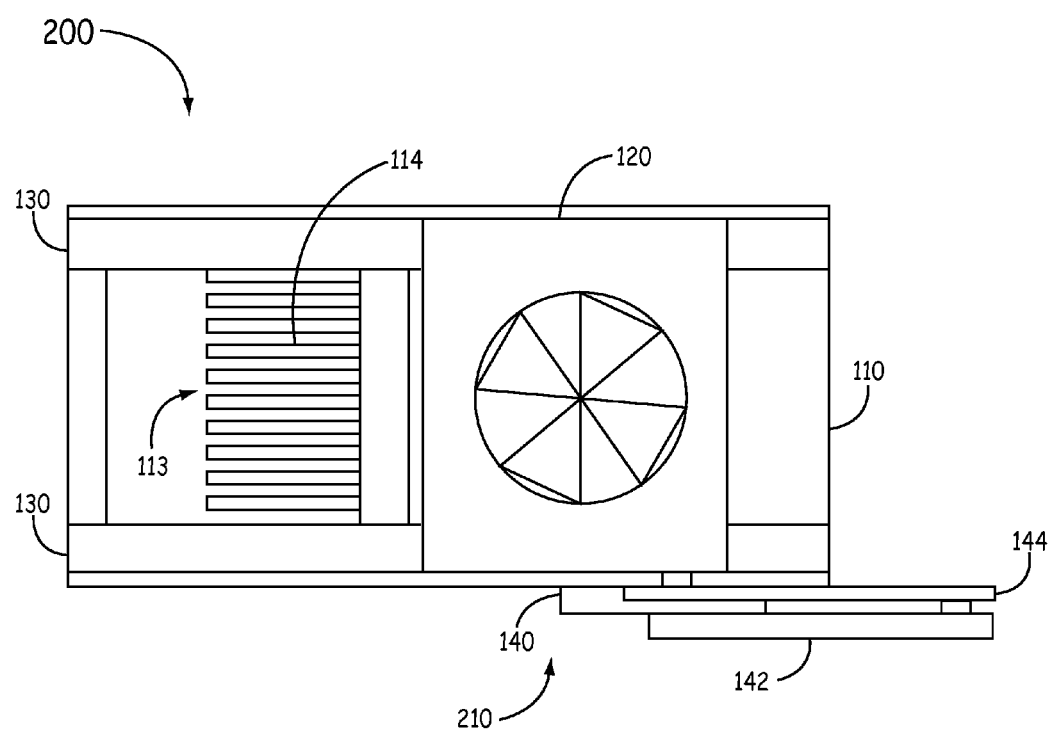
FIG. 2A-2B illustrate a retractable fan cooling system for an electronics enclosure of one embodiment of the present invention.
Figure 2B:
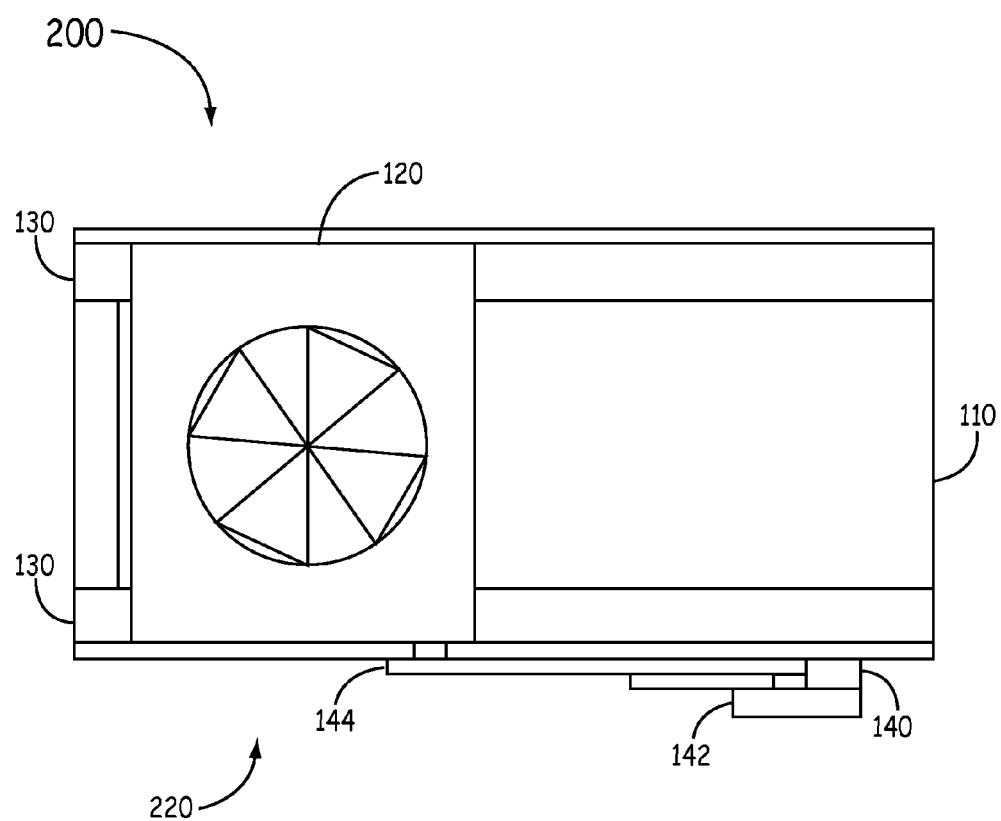

In one embodiment, controller 118 further controls operation of the cooling fan 120 as well as controlling whether it is in a retracted position (shown in FIG. 2A at 210) or fully engaged position (shown in FIG. 2B at 220). For example, in one embodiment controller 118 de-energizes cooling fan 120 when it is in the retracted position 210 and energizes it when it is in the fully engaged position 220. In one embodiment controller 118 further controls the speed of cooling fan 120 based on the temperatures measured by sensor 116. For example, controller 118 may run cooling fan 120 on at a low speed setting, a high speed setting, or the speed of cooling fan 120 may be continuously variable between high and low.

Further, in one embodiment, controller 118 will place cooling fan 120 into one of up to a plurality of positions between the retracted position 210 and the fully engaged position 220. For example, in one embodiment, controller 118 will keep cooling fan 120's fan speed low, but position cooling fan 120 partially over the heat sink 114 to combine forced circulation with natural convection. In one embodiment, fan position between the retracted position 210 and the fully engaged position 220 is controlled by controller 118 as a function of temperature within enclosure 110.

Figure 3A:
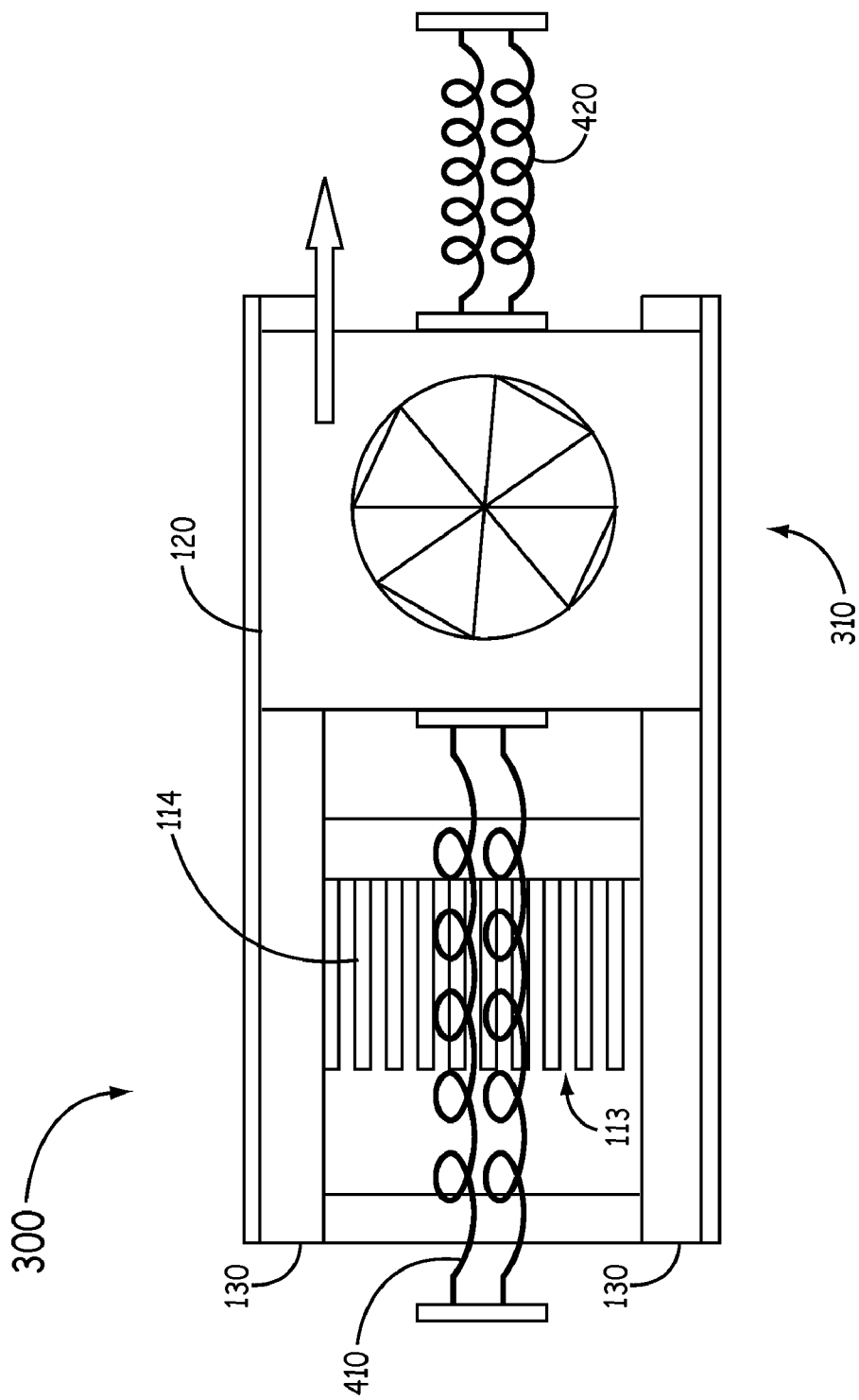
FIGS. 3A-3C illustrate a retractable fan cooling system for an electronics enclosure of one embodiment of the present invention.
Figure 3B:
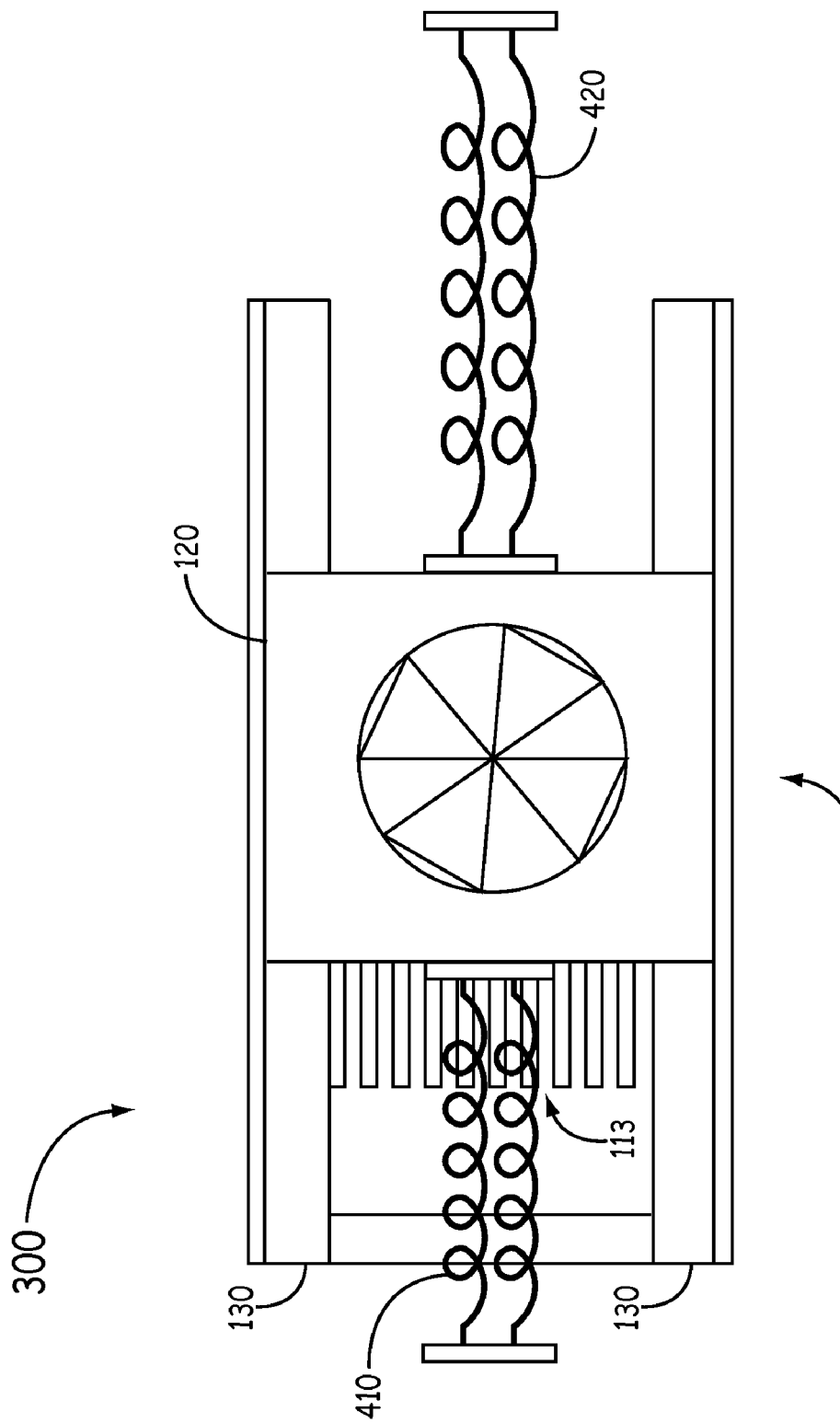
Figure 3C:
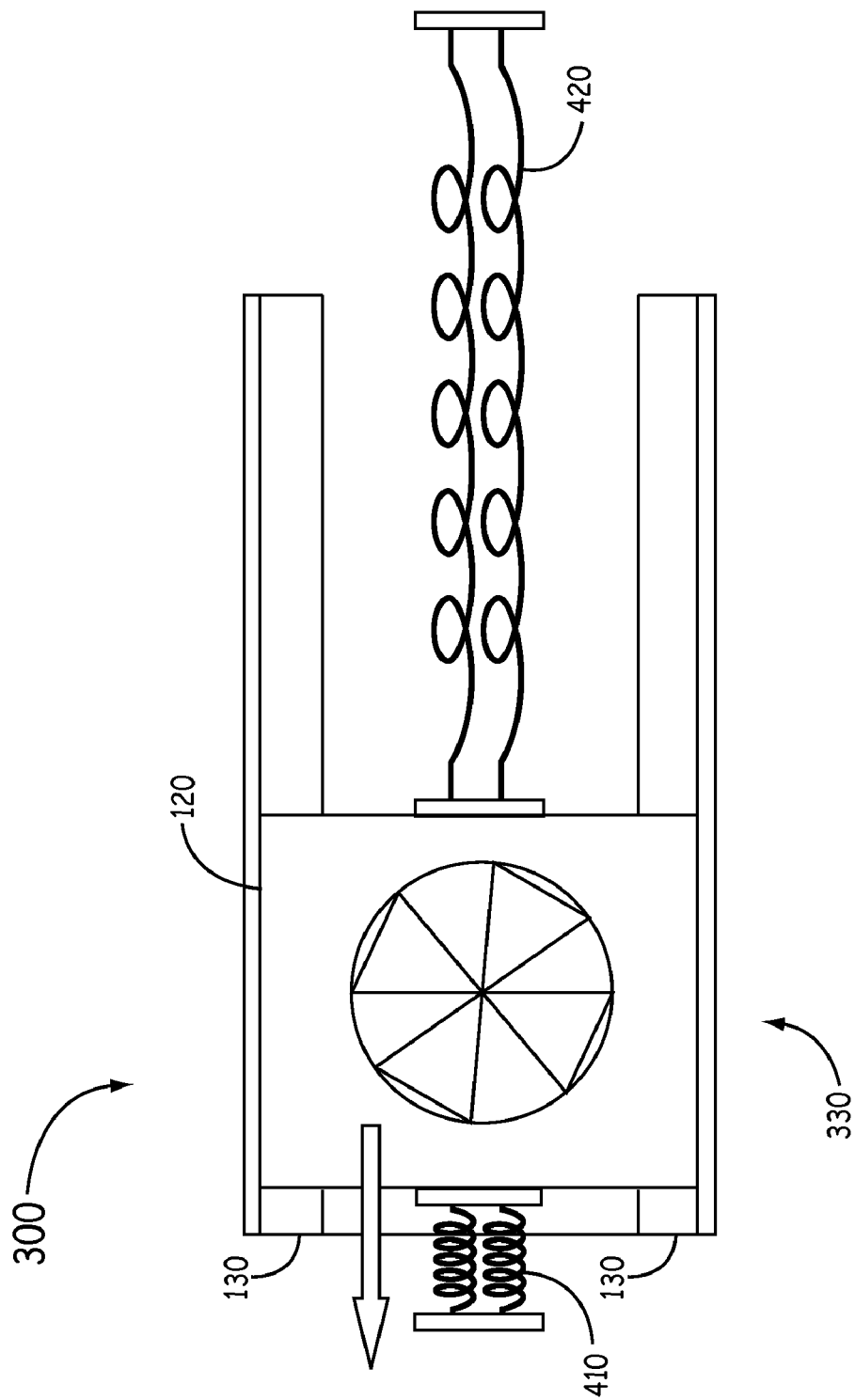

FIGS. 3A to 3C provide an illustration of an embodiment of cooling system 105, where the servo controlled mechanics of FIGS. 2A-2B are replaced with a thermally responsive positioning mechanism shown generally at 300. As in FIG. 2A-2B, cooling fan 120 slides along tracks 130 from a fully engaged position over heat sink 114 to a fully retracted position that does not interfere with natural convective air flow through chamber 111. Thermally responsive positioning mechanism 300 includes at least one thermally activated spring 410 (which may comprise one or more individual thermally activated spring components) and a set of one or more counter-springs 420. A "thermally activated spring", as that term is used herein, is device comprised of a material commonly referred to as a "memory metal" or "Nitinol material." In one embodiment, a spring of desired shape and length is formed from the Nitinol material. The spring undergoes a super-heating process which aligns its crystalline structure, effectively creating a memorized "setpoint shape" for that spring. When a force is applied to the spring (such as pulling on the spring) it will freely deform the material with little resistance. However, when the spring is re-heated to an activation temperature, it will attempt to return to its memorized "setpoint shape." As would be appreciated by one of ordinary skill in the art upon reading this specification, the activation temperature for a particular spring can be set by specifying the particular alloy of memory metal and other metals used to create the spring, and by adjusting the super-heating process which aligns the crystalline structure.

Referring to FIG. 3A, the thermally activated spring 410 is coupled to cooling fan 120 such that, when activated, it will pull cooling fan 120 along track 130 towards heat sink 114 and chamber 111. The set of one or more counter-springs 420 is coupled to cooling fan 120 such that, when the thermally activated spring 410 is not activated, it will pull cooling fan 120 along track 130 towards the refracted position (shown generally in FIG. 3A at 310).

In operation, heat exits the chamber 111, rising up across the thermally activated spring 410. In low temperature conditions (that is, when thermally activated spring 410 is below its activation temperature), thermally activated spring 410 will exert no appreciable resistance to the pulling force of counter-spring 420. Therefore, the force of counter-spring 420 will pull cooling fan 120 into the retracted position (shown at 310) out of the way of the natural convention air circulation through the fins 113 of heat sink 114. When the temperature of the heat exiting the chamber 111 increases above the activation temperature, thermally activated spring 410 will contract as it attempts to return to its setpoint shape and position. When the force exerted by the contracting thermally activated spring 410 exceeds the counterforce exerted by the count-spring 420, the cooling fan 120 will be pulled over the fins 113 of heat sink 140, and into the air circulation path of chamber 111. This is illustrated in FIGS. 2B and 2C, which respectively illustrate cooling fan 120 in a partially engaged position (shown generally at 320) and a fully engaged position (shown generally at 330).

In one embodiment, the cooling fan 120 will turn on based on a temperature measurement inside the enclosure. For example, in one embodiment temperature sensor 116 provides the temperature measurement to controller 118, which switches on the cooling fans at a predetermine temperature setpoint. As mentioned above controller 118 may provide simple on/off control of the cooling fan 120, or vary the fan speed based on the measured temperature. As would be appreciated by one of ordinary skill in the art after reading this specification, blocking the natural convention air circulation with a de-energized cooling fan 120 will inhibit air flow and in turn heat transfer. Therefore, in one embodiment, a sudden temperature increase sensed by sensor 116 will indicate to controller 118 that cooling fan 120 is in position above heat sink 114 and can be energized.

Figure 4:
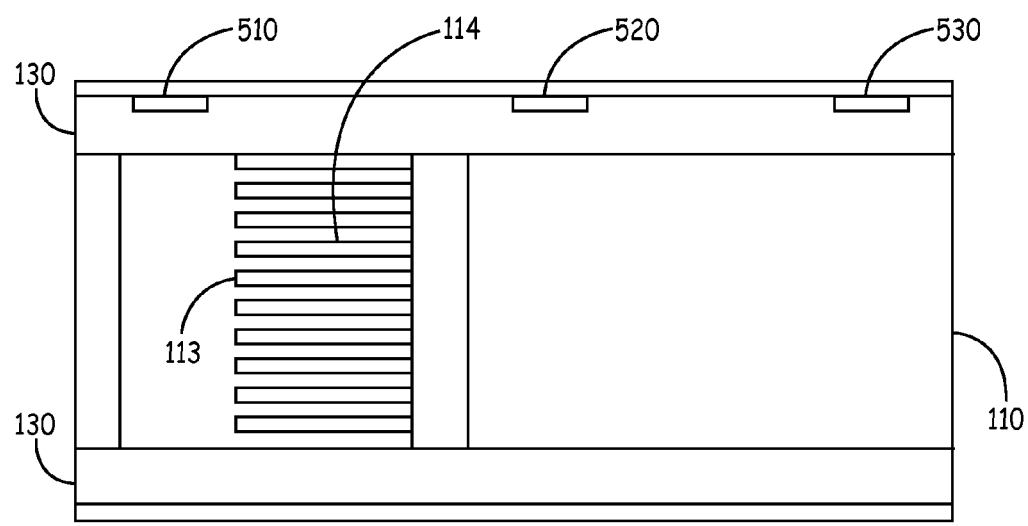
FIG. 4 illustrates cooling fan position sensing for a retractable fan cooling system for an electronics enclosure of one embodiment of the present invention.

In another embodiment, the cooling fan 120 is energized based on its physical position along track 130. For example, as illustrated in FIG. 4 the cooling system 105 includes one or more micro-switches (510, 520, 530) along track 130 that sense the physical position of cooling fan 120.

When the thermally activated spring 410 pulls cooling fan 120 into the engaged position 330 over chamber 111, micro-switch 510 is activated, which energizes cooling fan 120. Similarly, when temperatures are dropping and counter-springs 420 pull cooling fan 120 into retracted position 310, micro-switch 530 will deactivate the fans. In one embodiment, a plurality of switches may be used to control fan speed based on cooling fan position. For example, in one embodiment, cooling fan 120 is at full speed when positioned fully over the heat sink 114 and at a reduced speed when positioned only partially over the heat sink 114, as sensed by micro-switch 520. The micro-switches 510, 520, 530 along track 130 may be similarly used in other embodiments, such as with the servo-based embodiment described with respect to FIGS. 2A-2B.

Figure 5:
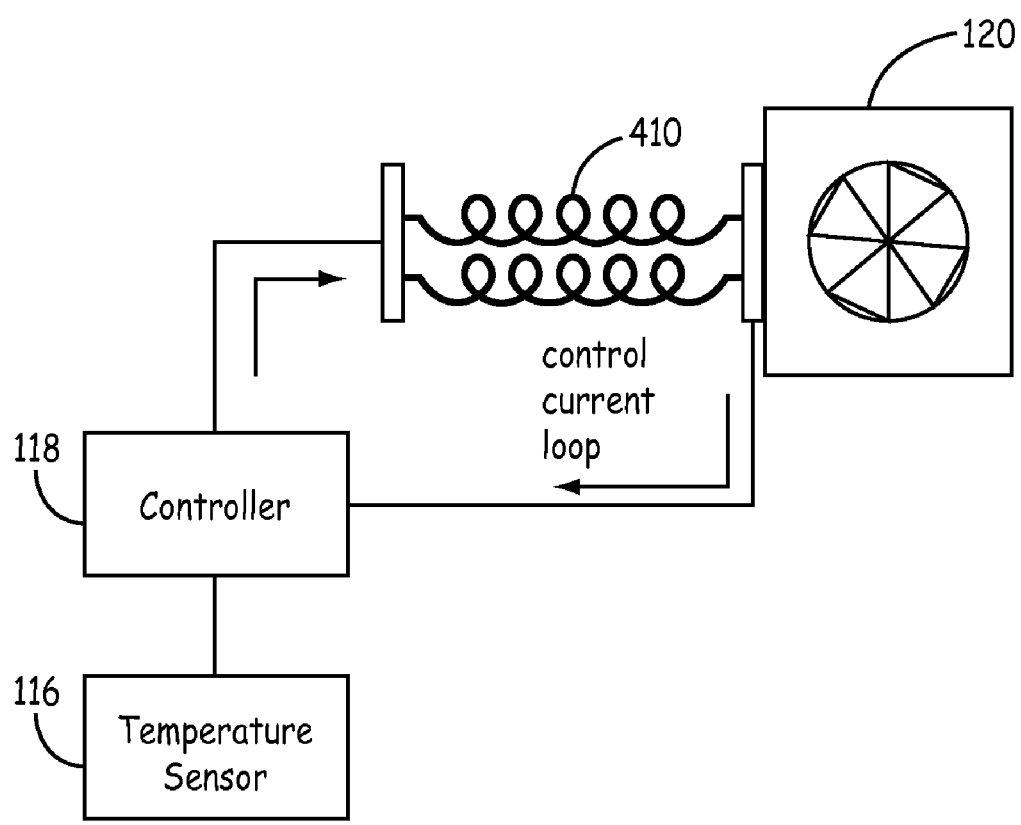
FIG. 5 illustrates a cooling fan position control system for a retractable fan cooling system for an electronics enclosure of one embodiment of the present invention.

In another embodiment, illustrated in FIG. 5, rather than relying on the heat exiting the heat sink 114 to activate thermally activated spring 410, controller 118 within enclosure 110 reads temperature from temperature sensor 116 and applies an electric current through the thermally activated spring 410. The electric current heats the material to its activation setpoint, causing thermally activated spring 410 to contract as described above. In one embodiment, controller 118 may provide simple on/off control of the electric current. In other embodiment, controller 118 will vary the current (and thus the heating of the Nitinol material) which in turn controls the force exerted by thermally activated spring 410 against counter-spring 420. By controlling the force exerted by thermal memory spring 215 against the counter-spring 220, the controller can control the position of cooling fan 120 along track 130.

Figure 6:
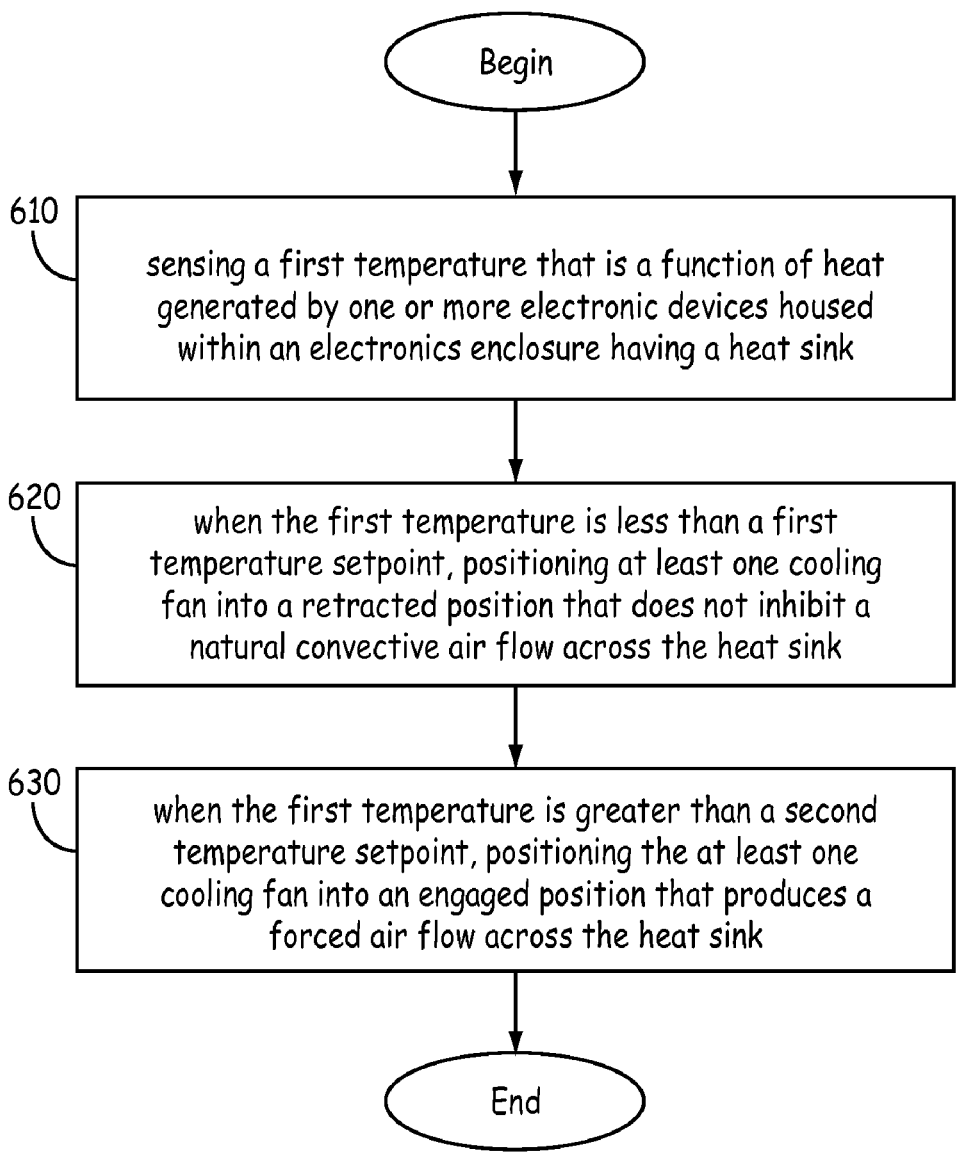
FIG. 6 illustrates a method of one embodiment of the present invention.

FIG. 6 is a flow chart of a method of one embodiment of the present invention for providing retractable fan cooling for an electronics enclosure. The method begins as 610 with sensing a first temperature that is a function of heat generated by one or more electronic devices housed within an electronics enclosure having a heat sink. As discussed above, in one embodiment, sensing a first temperature is performed by sensing either an ambient or component temperature with a sensor inside the electronics enclosure. In another embodiment, sensing a first temperature is performed by sensing heat from the heat sink.

The method continues to 620 wherein when the first temperature is less than a first temperature setpoint, the method proceeds with positioning at least one cooling fan into a retracted position that does not inhibit a natural convective air flow across the heat sink. In one embodiment, positioning at least one cooling fan into a retracted position is achieved by operating a servo that slide the at least one cooling fan along a track into the retracted position. In another embodiment, the at least one cooling fan is positioned into the retracted position by counter-springs.

The method continues to 630 wherein when the first temperature is greater than a second temperature setpoint, the method proceeds with positioning the at least one cooling fan into an engaged position that produces a forced air flow across the heat sink.

In one embodiment, positioning the at least one cooling fan into an engaged position is achieved by operating a servo to slide the at least one cooling fan into the engaged position. In another embodiment, the at least one cooling fan is positioned into the engaged position by thermally activated springs.

Although specific embodiments have been illustrated and described herein, it will be appreciated by those of ordinary skill in the art that any arrangement, which is calculated to achieve the same purpose, may be substituted for the specific embodiment shown. This disclosure is intended to cover any adaptations or variations of the present invention. Therefore, it is manifestly intended that this invention be limited only by the claims and the equivalents thereof.

What is claimed is:

1. A retractable fan cooling system for an electronics enclosure, the system comprising:
    at least one cooling fan coupled to an electronics enclosure having a heat sink; and
    a fan positioning mechanism coupled to the at least one cooling fan;
    wherein when a temperature inside the electronics enclosure is less than a first temperature, the positioning mechanism places the at least one cooling fan into a retracted position that does not inhibit a natural convective air flow across the heat sink; and
    wherein when the temperature inside the enclosure is greater than a second temperature, the positioning mechanism places the at least one cooling fan into an engaged position that produces a forced air flow across the heat sink;
    wherein the fan positioning mechanism further comprises:
        at least one thermally activated spring coupled to the at least one cooling fan; and
        at least one counter-spring coupled to the at least one cooling fan;
        wherein when the at least one thermally activated spring is below a activation temperature, the at least one counter-spring applies a first force to the at least one cooling fan that places the at least one cooling fan into the retracted position; and
    wherein when the at least one thermally activated spring is not below the activation temperature, the at least one thermally activated spring applies a second force to the at least one cooling fan that counters the first force applied by the at least one counter-spring.

2. The system of claim 1, wherein the temperature inside the electronics enclosure is one of a measurement of an ambient temperature inside the electronics enclosure or a measurement of a component temperature inside the electronics enclosure.

3. The system of claim 1, further comprising:
a track coupled to the electronics enclosure, wherein the at least one cooling fan is positioned along the track.

4. The system of claim 1, wherein the fan positioning mechanism further comprises:
a temperature sensor that measures the temperature inside the electronics enclosure; and
a controller coupled to the temperature sensor;
wherein the controller adjusts an electrical current flow through the at least one thermally activated spring that controls the second force applied by the at least one thermally activated spring; and
wherein the controller adjusts a position of the at least one cooling fan based on the temperature inside the electronics enclosure by adjusting the electrical current flow.

5. The system of claim 4, wherein the controller further adjusts a fan speed of the at least one cooling fan based on the temperature inside the electronics enclosure.

6. The system of claim 1, wherein the fan positioning mechanism further comprises:
a temperature sensor that measures the temperature inside the electronics enclosure; and
a controller coupled to the temperature sensor;
wherein the controller adjusts a fan speed of the at least one cooling fan based on the temperature inside the electronics enclosure.

7. The system of claim 1, further comprising:
a track coupled to the electronics enclosure, wherein the at least one cooling fan is positioned within the track.

8. The system of claim 7, further comprising:
a controller that adjusts a fan speed of the at least one cooling fan based on a position of the at least one cooling fan within the track.

9. The system of claim 1, wherein the at least one thermally activated spring is positioned over the heat sink such that natural convective air flow across the heat sink heats the at least one thermally activated spring.

10. A device for housing electronic devices having a retractable cooling fan system, the device comprising:
an enclosure having at least one electronic device;
a heat sink thermally coupled to at least one electronic device, wherein the heat sink transfers heat from the at least one electronic device to an environment external to the enclosure;
at least one cooling fan coupled to the enclosure; and
a fan positioning mechanism coupled to the enclosure and the at least one cooling fan;
wherein when a temperature inside the enclosure is less than a first temperature, the positioning mechanism places the at least one cooling fan into a retracted position that does not inhibit a natural convective air flow across the heat sink;
wherein when the temperature inside the enclosure is greater than a second temperature, the positioning mechanism places the at least one cooling fan into an engaged position that produces a forced air flow across the heat sink;
wherein the fan positioning mechanism further comprises:
at least one thermally activated spring coupled to the at least one cooling fan; and
at least one counter-spring coupled to the at least one cooling fan;
wherein when the at least one thermally activated spring is below a activation temperature, the at least one counter-spring applies a first force to the at least one cooling fan that places the at least one cooling fan into the retracted position; and
wherein when the at least one thermally activated spring is not below the activation temperature, the at least one thermally activated spring applies a second force to the at least one cooling fan that counters the first force applied by the at least one counter-spring.

11. The device of claim 10, wherein the temperature inside the electronics enclosure is one of a measurement of an ambient temperature inside the electronics enclosure or a measurement of a component temperature inside the electronics enclosure.

12. The device of claim 10, further comprising:
a track coupled to the enclosure, wherein the at least one cooling fan is positioned along the track.

13. The device of claim 10, further comprising:
a temperature sensor that measures the temperature inside the electronics enclosure; and
a controller coupled to the temperature sensor;
wherein the controller adjusts the positioning mechanism to position the at least one cooling fan based on the temperature inside the electronics enclosure.

14. The device of claim 13, wherein the controller adjusts a fan speed of the at least one cooling fan based on the temperature inside the electronics enclosure.

15. The device of claim 13, wherein the controller adjusts an electrical current flow through the at least one thermally activated spring that controls the second force applied by the at least one thermally activated spring; and
wherein the controller adjusts a position of the at least one cooling fan based on the temperature inside the electronics enclosure by adjusting the electrical current flow.

16. The device of claim 10, wherein the at least one thermally activated spring is positioned over the heat sink such that natural convective air flow across the heat sink heats the at least one thermally activated spring.

* * * * *